(12) United States Patent
Zha et al.

(10) Patent No.: US 11,693,280 B2
(45) Date of Patent: Jul. 4, 2023

(54) DISPLAY DEVICE AND MANUFACTURING METHOD THEREOF

(71) Applicant: Shenzhen China Star Optoelectronics Semiconductor Display Technology Co., Ltd., Guangdong (CN)

(72) Inventors: Bao Zha, Guangdong (CN); Miao Jiang, Guangdong (CN); Jiangbo Yao, Guangdong (CN); Lixuan Chen, Guangdong (CN); Xin Zhang, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 325 days.

(21) Appl. No.: 17/056,033

(22) PCT Filed: Oct. 22, 2020

(86) PCT No.: PCT/CN2020/122763
§ 371 (c)(1),
(2) Date: Nov. 17, 2020

(87) PCT Pub. No.: WO2022/047916
PCT Pub. Date: Mar. 10, 2022

(65) Prior Publication Data
US 2022/0308405 A1    Sep. 29, 2022

(30) Foreign Application Priority Data

Sep. 3, 2020 (CN) .......................... 202010914762.8

(51) Int. Cl.
*G02F 1/1343* (2006.01)
*G02F 1/1333* (2006.01)
(Continued)

(52) U.S. Cl.
CPC ...... *G02F 1/134309* (2013.01); *G02F 1/1339* (2013.01); *G02F 1/1368* (2013.01);
(Continued)

(58) Field of Classification Search
CPC .............. G06F 3/0412; G02F 1/13338; G02F 1/13312; G02F 1/13324; H01L 27/3227
See application file for complete search history.

(56) References Cited

U.S. PATENT DOCUMENTS

2003/0122800 A1\* 7/2003 Yu .......................... G02F 1/133
345/173
2011/0272689 A1 11/2011 Park
(Continued)

FOREIGN PATENT DOCUMENTS

CN    107342370    11/2017
CN    107870697    4/2018
(Continued)

*Primary Examiner* — Jessica M Merlin

(57) ABSTRACT

A display device and a manufacturing method thereof are provided. The display device includes a first substrate, a first array structure layer disposed on the first substrate, and a second substrate disposed on the first array structure layer. The first array structure layer includes a photosensitive sensor, a touch sensor, and a spacer layer. The touch sensor includes a receiving electrode. The spacer layer is disposed between the photosensitive sensor and the receiving electrode. The receiving electrode is disposed on a side of the spacer layer away from the photosensitive sensor.

16 Claims, 3 Drawing Sheets

(51) Int. Cl.
  *G02F 1/1339*   (2006.01)
  *G02F 1/1362*   (2006.01)
  *G02F 1/1368*   (2006.01)
  *G06F 3/041*    (2006.01)
  *G02F 1/1335*   (2006.01)
  *H10K 59/40*    (2023.01)
  *H10K 59/60*    (2023.01)

(52) U.S. Cl.
  CPC .... *G02F 1/13338* (2013.01); *G02F 1/133345* (2013.01); *G02F 1/136209* (2013.01); *G06F 3/0412* (2013.01); *G02F 1/133514* (2013.01); *G02F 2202/103* (2013.01); *G02F 2202/28* (2013.01); *H10K 59/40* (2023.02); *H10K 59/60* (2023.02)

(56) References Cited

U.S. PATENT DOCUMENTS

2019/0005293 A1    1/2019  Kravets et al.
2020/0411608 A1   12/2020  Tang et al.

FOREIGN PATENT DOCUMENTS

| CN | 110214378 A | * | 9/2019 | ........... G06F 3/0412 |
| CN | 110286796 |  | 9/2019 | |
| CN | 111276522 |  | 6/2020 | |
| CN | 111524917 |  | 8/2020 | |
| WO | WO 2016/206013 |  | 12/2016 | |

* cited by examiner

DISPLAY DEVICE AND MANUFACTURING METHOD THEREOF

RELATED APPLICATIONS

This application is a National Phase of PCT Patent Application No. PCT/CN2020/122763 having International filing date of Oct. 22, 2020, which claims the benefit of priority of Chinese Patent Application No. 202010914762.8 filed on Sep. 3, 2020. The contents of the above applications are all incorporated by reference as if fully set forth herein in their entirety.

FIELD AND BACKGROUND OF THE INVENTION

The present invention relates to the field of display technologies, and in particular, to a display device and a manufacturing method thereof.

At present, integrating various sensors in display panels is a mainstream trend to be developed, especially touch sensors and photosensitive sensors. However, when the touch sensors and the photosensitive sensors are integrated into the display panels, there is a parasitic capacitance between the photosensitive sensors and the touch sensors, which causes a signal crosstalk between the photosensitive sensors and the touch sensors.

The present application provides a display device and a manufacturing method thereof, so as to solve the problem of signal crosstalk in the display device in the prior art and improve reliability of the display device.

SUMMARY OF THE INVENTION

The present invention provides a display device and a manufacturing method thereof, so as to solve a problem of signal crosstalk in a display device in the prior art and improve reliability of the display device.

The present invention provides a display device, comprising:

a first substrate;

a first array structure layer disposed on the first substrate, wherein the first array structure layer comprises a photosensitive sensor, a touch sensor, and a spacer layer, the photosensitive sensor comprises a gate, a semiconductor portion, a source, and a drain, the touch sensor comprises a transmitting electrode and a receiving electrode, the spacer layer is disposed between the photosensitive sensor and the receiving electrode, and the receiving electrode is disposed on a side of the spacer layer away from the photosensitive sensor; and a second substrate disposed on the first array structure layer.

In the display device provided by the present invention, the first array structure layer further comprises a gate insulating layer, the gate is disposed on the first substrate, the gate insulating layer covers the gate, the transmitting electrode and the semiconductor portion are disposed in a same layer and are located on the gate insulating layer, the transmitting electrode and the semiconductor portion are insulated from each other, the semiconductor portion and the gate are disposed in one-to-one correspondence, and the source and the drain are disposed on opposite sides of the semiconductor portion and are electrically connected to the semiconductor portion.

In the display device provided by the present invention, the first array structure layer further comprises a gate insulating layer, the transmitting electrode and the gate are disposed in a same layer and are located on the first substrate, the gate insulating layer covers the transmitting electrode and the gate, the semiconductor portion is disposed on the gate insulating layer, the semiconductor portion and the gate are disposed in one-to-one correspondence, and the source and the drain are disposed on opposite sides of the semiconductor portion and are electrically connected to the semiconductor portion.

In the display device provided by the present invention, the spacer layer comprises a first spacer sub-layer, and the first spacer sub-layer is disposed between the photosensitive sensor and the receiving electrode.

In the display device provided by the present invention, the spacer layer further comprises a second spacer sub-layer, the second spacer sub-layer is disposed on the first spacer sub-layer, and the receiving electrode is disposed on the second spacer sub-layer.

In the display device provided by the present invention, a dielectric constant of the first spacer sub-layer and a dielectric constant of the second spacer sub-layer range from 1.3 to 5.

In the display device provided by the present invention, a thickness of the first spacer sub-layer ranges from 1000 nm to 5000 nm, and a thickness of the second spacer sub-layer ranges from 1000 nm to 5000 nm.

In the display device provided by the present invention, the display device further comprises a first passivation layer disposed between the photosensitive sensor and the first spacer sub-layer.

In the display device provided by the present invention, the display device further comprises a second passivation layer disposed between the second spacer sub-layer and the receiving electrode.

In the display device provided by the present invention, the display device further comprises a light shielding layer disposed on the first spacer sub-layer and disposed on the semiconductor portion.

In the display device provided by the present invention, the display device further comprises a display structure and an adhesive layer, wherein the display structure is adhered to the first substrate through the adhesive layer.

In the display device provided by the present invention, the display structure comprises a third substrate and a second array structure layer, the third substrate is located on a side away from the adhesive layer, and the second array structure layer is disposed on the third substrate.

In the display device provided by the present invention, the display structure further comprises a black matrix layer, the black matrix layer comprises a first black matrix portion and a second black matrix portion, the first black matrix portion is disposed on the second array structure layer in an array, and the second black matrix portion is disposed on opposite sides of the first black matrix portion.

In the display device provided by the present invention, the display structure further comprises a first conductive layer covering the second array structure layer and the first black matrix portion.

In the display device provided by the present invention, the display structure further comprises a liquid crystal layer disposed on the first conductive layer and in the second black matrix portion.

In the display device provided by the present invention, the display structure further comprises a second conductive layer covering the liquid crystal layer.

In the display device provided by the present invention, the display structure further comprises a color filter layer disposed on the second conductive layer.

In the display device provided by the present invention, the display structure further comprises a fourth substrate, the fourth substrate is disposed on the second black matrix portion and the color filter layer, and the fourth substrate is adhered to the first substrate through the adhesive layer.

The present invention further provides a method of manufacturing a display device, comprising following steps:

providing a first substrate;

providing a first array structure layer on the first substrate, wherein the first array structure layer comprises a photosensitive sensor, a touch sensor, and a spacer layer, the photosensitive sensor comprises a gate, a semiconductor portion, a source, and a drain, the touch sensor comprises a transmitting electrode and a receiving electrode, the spacer layer is disposed between the photosensitive sensor and the receiving electrode, and the receiving electrode is disposed on a side of the spacer layer away from the photosensitive sensor; and;

disposing a second substrate on the first array structure layer.

In the manufacturing method of the display device provided in the present invention, after the step of disposing the second substrate on the first array structure layer, the manufacturing method further comprises:

adhering a display structure to the first substrate through an adhesive layer.

The present invention provides a display device and a manufacturing method thereof. The display device comprises a first substrate, a first array structure layer disposed on the first substrate, and a second substrate disposed on the first array structure layer. Wherein the first array structure layer comprises a photosensitive sensor, a touch sensor, and a spacer layer. The photosensitive sensor comprises a gate, a semiconductor portion, a source, and a drain. The touch sensor comprises a transmitting electrode and a receiving electrode. The spacer layer is disposed between the photosensitive sensor and the receiving electrode, and the receiving electrode is disposed on a side of the spacer layer away from the photosensitive sensor. By disposing the gate and the receiving electrode on opposite sides of the spacer layer, a parasitic capacitance of layers between the photosensitive sensor and the touch sensor is reduced, thereby reducing a signal crosstalk between the photosensitive sensor and the touch sensor and improving reliability of the display device.

BRIEF DESCRIPTION OF THE SEVERAL VIEWS OF THE DRAWINGS

In order to more clearly illustrate technical solutions in the present invention, the following will briefly introduce drawings needed in the description of the embodiments. Obviously, the drawings in the following description are only some of the embodiments of the present invention, and those skilled in the art can obtain other drawings according to the drawings without any creative work.

DESCRIPTION OF SPECIFIC EMBODIMENTS OF THE INVENTION

The technical solution in the embodiments of the present invention will be clearly and completely described below with reference to the accompanying drawings in the embodiments of the present invention. It is to be understood that the described embodiments are merely exemplary of the invention, and not restrictive of the full scope of the invention. All other embodiments, which can be obtained by a person skilled in the art without inventive step based on the embodiments of the present invention, are within the scope of the present invention.

Figure 1:
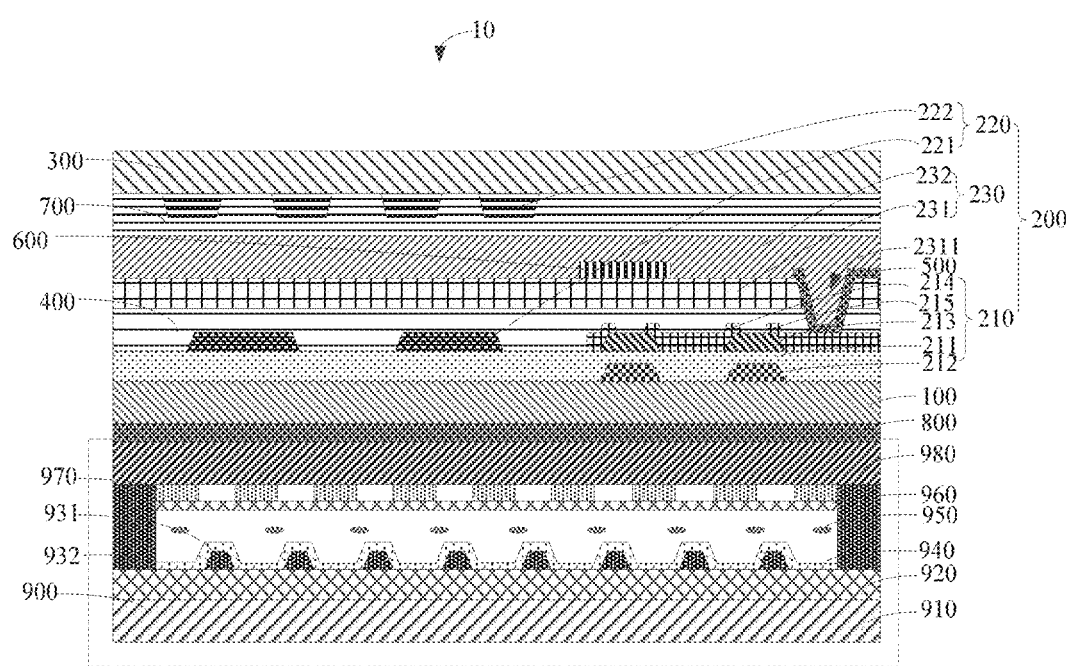
FIG. 1 is a cross-sectional view of a first structure of a display device provided by the present invention.

Please refer to FIG. 1, which is a cross-sectional view of a first structure of a display device provided by the present invention. The present invention provides a display device 10. The display device 10 comprises a first substrate 100, a first array structure layer 200, and a second substrate 300.

The first array structure layer 200 is disposed on the first substrate 100. The first array structure layer 200 comprises a photosensitive sensor 210, a touch sensor 220, and a spacer layer 230. The photosensitive sensor 210 comprises a gate insulating layer 211, a gate 212, a semiconductor portion 213, a source 214, and a drain 215. The touch sensor 220 comprises a transmitting electrode 221 and a receiving electrode 222. The spacer layer 230 is disposed between the photosensitive sensor 210 and the receiving electrode 222. The receiving electrode 222 is disposed on a side of the spacer layer 230 away from the photosensitive sensor 210. Specifically, the gate 212 is disposed on the first substrate 100. The gate insulating layer 211 covers the gate 212. The transmitting electrode 221 and the semiconductor portion 213 are disposed in a same layer and are located on the gate insulating layer 211. The semiconductor portion 213 is amorphous silicon. The transmitting electrode 221 and the semiconductor portion 213 are insulated from each other. The semiconductor portion 213 and the gate 212 are disposed in one-to-one correspondence. The source 214 and the drain 215 are disposed on opposite sides of the semiconductor portion 213 and are electrically connected to the semiconductor portion 213. A circuit structure of the photosensitive sensor 210 may be 2T1C, 3T1C, 4T1C, or 5T1C. In the present invention, the circuit structure of the photosensitive sensor 210 is a 2T1C photosensitive sensor. 2T comprises a switching thin film transistor and an infrared thin film transistor, and 1C is a capacitor.

In the present invention, the transmitting electrode is disposed on the gate insulating layer, which increases a mutual capacitance of the touch sensor, thereby improving sensitivity of the touch sensor.

In an embodiment, the display device 10 further comprises a first passivation layer 400. The first passivation layer 400 covers the gate insulating layer 211, the transmitting electrode 221, the semiconductor portion 213, the source 214, and the drain 215.

In an embodiment, the spacer layer 230 comprises a first spacer sub-layer 231. The first spacer sub-layer 231 is disposed between the photosensitive sensor 210 and the receiving electrode 222. Specifically, the first spacer sub-layer 231 covers the first passivation layer 400. The first spacer sub-layer 231 comprises a through hole 2311. The through hole 2311 passes through the first passivation layer 400 and the first spacer sub-layer 231 to expose the drain 215. A thickness of the first spacer sub-layer 321 ranges from 1000 nm to 5000 nm. Specifically, the thickness of the first spacer sub-layer 231 is 1200 nm, 2000 nm, 2500 nm, 3200 nm, 4500 nm, etc. A dielectric constant of a material of the first spacer sub-layer 231 ranges from 1.3 to 5. Specifically, the dielectric constant of the material of the first spacer sub-layer 231 may be 1.4, 2.1, 3, 4.5, etc.

In an embodiment, the material of the first spacer sub-layer 231 may be soluble polytetrafluoroethylene.

In an embodiment, the display device 10 further comprises a common electrode layer 500. The common electrode layer 500 is disposed in the through hole 2311 and on the first spacer sub-layer 231. The common electrode layer 500 is electrically connected to the drain 215 through the through hole 2311 to facilitate an external connection of the drain. A material of the common electrode layer 500 is indium tin oxide.

In an embodiment, the display device 10 further comprises a light shielding layer 600. The light shielding layer 600 is disposed on the first spacer sub-layer 231 and is disposed on the semiconductor portion 213.

In an embodiment, the spacer layer 230 may further comprise a second spacer sub-layer 232. The second spacer sub-layer 232 covers the first spacer sub-layer 231, the common electrode layer 500, and the light shielding layer 600. A dielectric constant of a material of the second spacer sub-layer 232 ranges from 1.3 to 5. Specifically, the dielectric constant of the material of the second spacer sub-layer 232 may be 1.6, 2.5, 3, or 4.8. A thickness of the second spacer sub-layer 232 ranges from 1000 nm to 5000 nm. Specifically, the thickness of the second spacer sub-layer 232 is 1200 nanometers, 2000 nanometers, 2500 nanometers, 3200 nanometers, 4500 nanometers, etc.

In an embodiment, the material of the second spacer layer 232 may be OCA optical glue.

In an embodiment, the display device 10 further comprises a second passivation layer 700. The second passivation layer 700 is disposed between the second spacer sub-layer 232 and the receiving electrode 222. Specifically, the second passivation layer 700 covers the second spacer sub-layer 232. The receiving electrode 222 is disposed on the second passivation layer 700.

The second substrate 300 is disposed on the receiving electrode 222 and the second passivation layer 700.

In an embodiment, the display device 10 further comprises a display structure 800 and an adhesive layer 900. The display structure 800 is adhered to the first substrate 100 through the adhesive layer 900. A material of the adhesive layer 900 is OCA optical glue. Specifically, the display structure 800 comprises a third substrate 910, a second array structure layer 920, a black matrix layer 930, a first conductive layer 940, a liquid crystal layer 950, a second conductive layer 960, a color film layer 970, and a fiurth substrate 980. The second array structure layer 920 is disposed on the third substrate 910. The black matrix layer 930 comprises a first black matrix portion 931 and a second black matrix portion 932. The first black matrix portion 931 is disposed on the first array structure layer 920. The second black matrix portion 932 is disposed on opposite sides of the first black matrix portion 931. The first conductive layer 940 covers the second array structure layer 920 and the first black matrix portion 931. The liquid crystal layer 950 is disposed on the first conductive layer 940 and in the second black matrix portion 932. The second conductive layer 960 covers the liquid crystal layer 950. The color filter layer 970 is disposed on the second conductive layer 960. The fourth substrate 980 is disposed on the second black matrix portion 932 and the color filter layer 970. The fourth substrate 980 is adhered to the first substrate 100 through the adhesive layer 900.

The display device provided by the present invention may be a liquid crystal display device or an organic light emitting diode display device.

In the present invention, by disposing the receiving electrode of the touch sensor on the second substrate, and disposing the gate of the photosensitive sensor on the first substrate, a parasitic capacitance between the gate of the photosensitive sensor and the receiving electrode of the touch sensor is reduced, and a signal crosstalk between the gate of the photosensitive sensor and the receiving electrode of the touch sensor is reduced. Thus, the photosensitive sensor and the touch sensor can work at the same time, which can realize functions of short-range touch and remote control, thereby improving reliability of the display device. The spacer layer is formed of a material with a low dielectric constant and is disposed between the receiving electrode and the gate to further reduce a parasitic capacitance between the receiving electrode and the gate, which will further improve the reliability of the display device.

Figure 2:
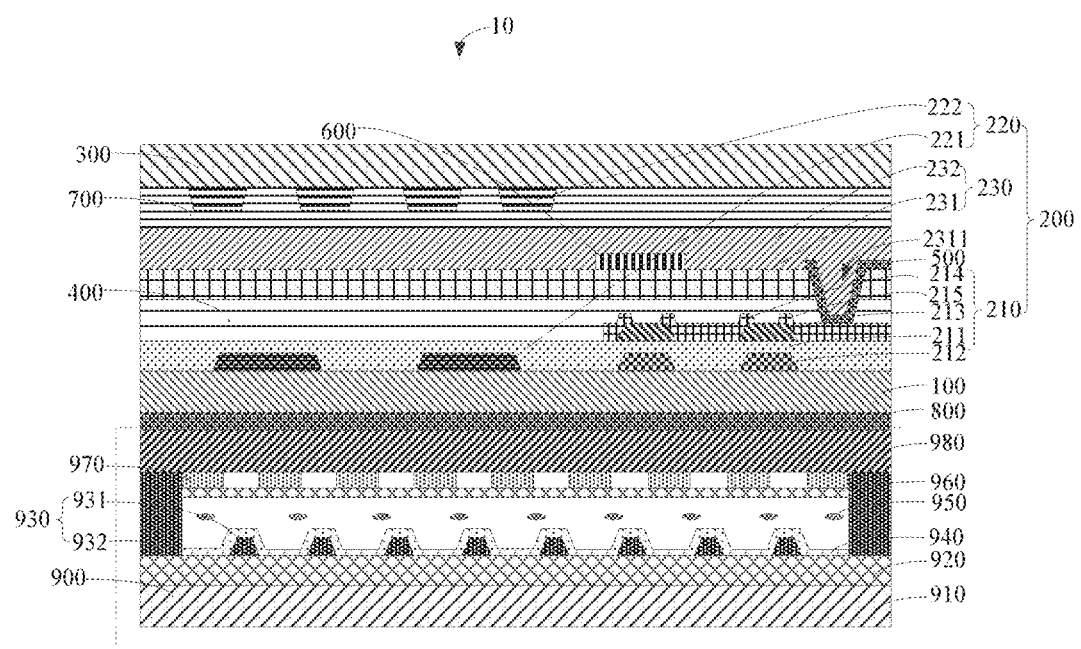
FIG. 2 is a cross-sectional view of a second structure of the display device provided by the present invention.

Please refer to FIG. 2. FIG. 2 is a cross-sectional view of a second structure of the display device provided by the present invention. It should be noted that a difference between FIG. 2 and FIG. 1 is that the transmitting electrode 221 and the gate 212 are disposed in a same layer and are located on the first substrate 100. The gate insulating layer 211 covers the transmitting electrode 221 and the gate 212. Other structures are shown in FIG. 1 and will not be repeated here.

Figure 3:
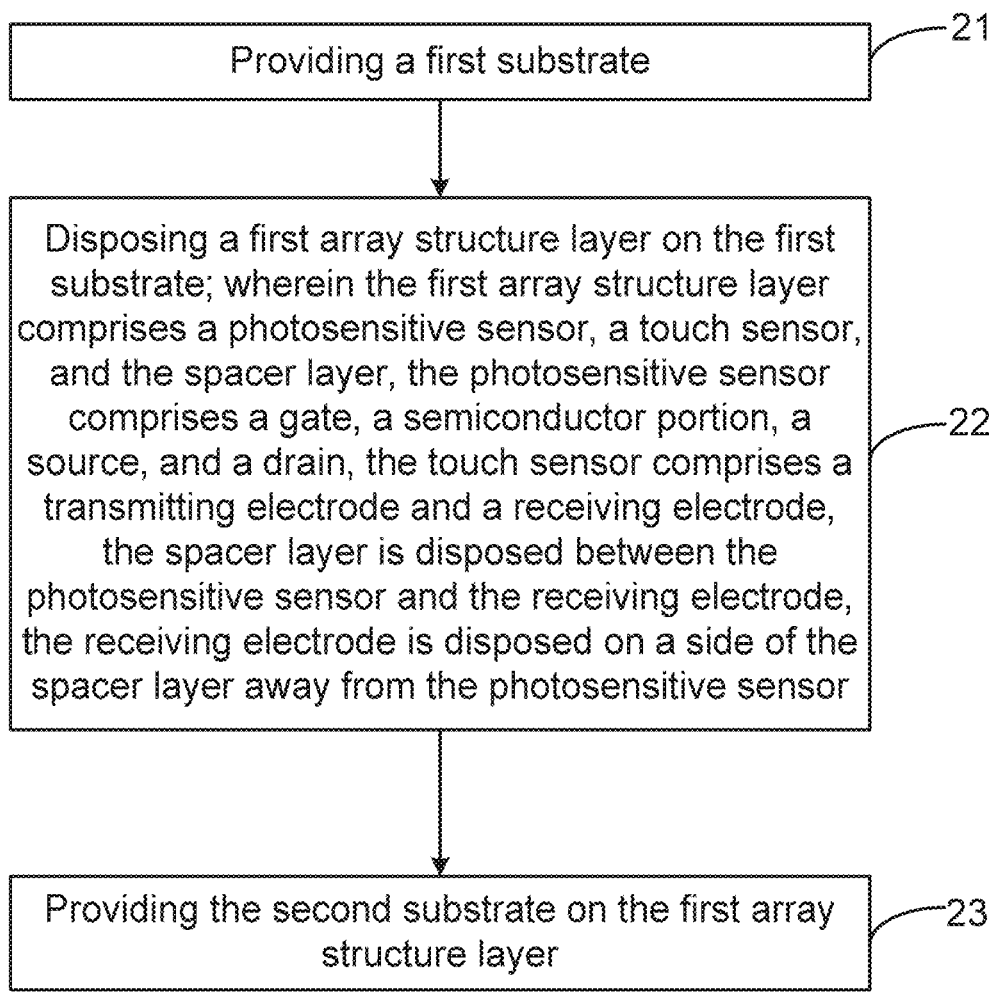
FIG. 3 is a flowchart of a manufacturing method of the display device provided by the present invention.

Please refer to FIG. 3. FIG. 3 is a flowchart of a manufacturing method of the display device provided by the present invention. The present invention further provides the manufacturing method of the display device 10, the manufacturing method comprises:

Step 21: Providing the first substrate 100.

Step 22: Disposing the first array structure layer 200 on the first substrate 100. Wherein, the first array structure layer 200 comprises the photosensitive sensor 210, the touch sensor 220, and the spacer layer 230. The photosensitive sensor 210 comprises the gate 212, the semiconductor portion 213, the source 214, and the drain 215. The touch sensor 220 comprises the transmitting electrode 221 and the receiving electrode 222. The spacer layer 230 is disposed between the photosensitive sensor 210 and the receiving electrode 222. The receiving electrode 222 is disposed on the side of the spacer layer 230 away from the photosensitive sensor 210.

Specifically, a gate material is disposed on the first substrate 100, and the gate 212 is formed by exposure and etching. The material of the gate 212 comprises one or a combination of Al, Cu, and Mo. The gate 212 may be a single layer or multiple layers. The gate insulating layer 211 is formed on the first substrate 100 and the gate 212. A material of the semiconductor portion 213 is disposed on the gate insulating layer 211, and the semiconductor portion 213 is formed by exposure and etching. The material of the semiconductor portion 213 is amorphous silicon. A metal layer is deposited on the gate insulating layer 211 and the semiconductor portion 213, and the transmitting electrode 221, the source 214, and the drain 215 are formed by exposure and etching. The transmitting electrode 221 is disposed on the gate insulating layer 211. The source 214 and the drain 215 are disposed on the opposite sides of the semiconductor portion 213 and are electrically connected to the semiconductor portion 213. A material of the metal layer comprises one or a combination of Al, Cu, and Mo.

In another embodiment, the metal layer is provided on the first substrate 100, and the receiving electrode 222 and the gate 212 are formed by exposure and etching. The gate insulating layer 211 is formed on the first substrate 100, the gate 212, and the receiving electrode 222. The semiconductor portion 213 is formed on the gate insulating layer 211.

Then, the first passivation layer 400 is formed on the gate insulating layer 211, the transmitting electrode 221, the semiconductor portion 213, the source 214, and the drain 215.

Then, the material of the first spacer sub-layer 231 is disposed on the first passivation layer 400, and the first spacer sub-layer 231 is formed by exposure and etching. The first spacer sub-layer 231 comprises the through hole 2311. The through hole 2311 passes through the first passivation layer 400 and the first spacer sub-layer 231 to expose the drain 215. The thickness of the first spacer sub-layer 321 ranges from 1000 nm to 5000 nm. Specifically, the thickness of the first spacer sub-layer 231 is 1200 nm, 2000 nm, 2500 nm, 3200 nm, 4500 nm, etc. The dielectric constant of the material of the first spacer sub-layer 231 ranges from 1.3 to 5. Specifically, the dielectric constant of the material of the first spacer sub-layer 231 may be 1.4, 2.1, 3, 4.5, etc.

In an embodiment, the material of the first spacer sub-layer 231 may be soluble polytetrafluoroethylene.

Then, A material of the common electrode layer 500 is disposed in the through hole 2311 and on the first spacer sub-layer 231, and the common electrode layer 500 is formed by exposure and etching. The common electrode layer 500 is electrically connected to the drain 215 through the through hole 2311 to facilitate the external connection of the drain. The material of the common electrode layer 500 is indium tin oxide.

Then, the light shielding layer 600 is provided on the first spacer sub-layer 231. The light shielding layer 600 is disposed on the semiconductor portion 213.

Then, the material of the second spacer sub-layer 232 is disposed on the first spacer sub-layer 231, the common electrode layer 500, and the light shielding layer 600, and the second spacer sub-layer 232 is formed by exposure and etching. The dielectric constant of the material of the second spacer sub-layer 232 ranges from 1.3 to 5. Specifically, the dielectric constant of the material of the second spacer sub-layer 232 may be 1.6, 2.5, 3, or 4.8. The thickness of the second spacer sub-layer 232 ranges from 1000 nm to 5000 nm. Specifically, the thickness of the second spacer sub-layer 232 is 1200 nanometers, 2000 nanometers, 2500 nanometers, 3200 nanometers, 4500 nanometers, etc.

In an embodiment, the material of the second spacer sub-layer 232 may be OCA optical glue.

Step 23: Providing the second substrate 300 on the first array structure layer 200.

A material of the receiving electrode is disposed on the second substrate 300, and the receiving electrode 222 is formed by exposure and etching. The second passivation layer 700 is formed on the second substrate 300 and the receiving electrode 222. The second passivation layer 700 is adhered to the second spacer sub-layer 232.

In an embodiment, after the step of disposing the second substrate 300 on the first array structure layer 200, the manufacturing method further comprises:

adhering the display structure 800 to the first substrate 100 through the adhesive layer 900. The material of the adhesive layer 900 is OCA optical glue. Specifically, the display structure 800 comprises the third substrate 910, the second array structure layer 920, the black matrix layer 930, the first conductive layer 940, the liquid crystal layer 950, the second conductive layer 960, the color film layer 970, and the fourth substrate 980. The second array structure layer 920 is disposed on the third substrate 910. The black matrix layer 930 comprises the first black matrix portion 931 and the second black matrix portion 932. The first black matrix portion 931 is disposed on the first array structure layer 920. The second black matrix portion 932 is disposed on the opposite sides of the first black matrix portion 931. The first conductive layer 940 covers the second array structure layer 920 and the first black matrix portion 931. The liquid crystal layer 950 is disposed on the first conductive layer 940 and in the second black matrix portion 932. The second conductive layer 960 covers the liquid crystal layer 950. The color filter layer 970 is disposed on the second conductive layer 960. The fourth substrate 980 is disposed on the second black matrix portion 932 and the color filter layer 970. The fourth substrate 980 is adhered to the first substrate 100 through the adhesive layer 900.

In the present invention, by disposing the receiving electrode of the touch sensor on the second substrate, and disposing the gate of the photosensitive sensor on the first substrate, the transmitting electrode can be formed with the gate or the source and the drain with only one mask, and only 6 masking processes are needed to synchronize the display device integrating the photosensitive sensor and the touch sensor. It can realize the functions of short-range touch and remote light control, which is beneficial to improve a composite function of the display device and reduce production costs.

The present invention provides the display device and the manufacturing method thereof. The display device comprises the first substrate, the first array structure layer disposed on the first substrate, and the second substrate disposed on the first array structure layer. Wherein, the first array structure layer comprises the photosensitive sensor, the touch sensor, and the spacer layer. The photosensitive sensor comprises the gate, the semiconductor portion, the source, and the drain. The touch sensor comprises the transmitting electrode and the receiving electrode. The spacer layer is disposed between the photosensitive sensor and the receiving electrode, and the receiving electrode is disposed on the side of the spacer layer away from the photosensitive sensor. By disposing the gate and the receiving electrode on the opposite sides of the spacer layer, the parasitic capacitance of the layers between the photosensitive sensor and the touch sensor is reduced, thereby reducing the signal crosstalk between the photosensitive sensor and the touch sensor and improving the reliability of the display device.

The above provides a detailed introduction to the implementation of the present invention. In this article, specific examples are used to explain the principles and implementation of the present invention. The description of the above embodiments is only used to help understand the present invention. At the same time, for those skilled in the art, according to the idea of the present invention, there will be changes in the specific implementation and application scope. In summary, the content of this specification should not be construed as a limitation on the present invention.

What is claimed is:

1. A display device, comprising:
 a first substrate;
 a first array structure layer disposed on the first substrate, wherein the first array structure layer comprises a photosensitive sensor, a touch sensor, and a spacer layer, the photosensitive sensor comprises a gate, a semiconductor portion, a source, and a drain, the touch sensor comprises a transmitting electrode and a receiving electrode, the spacer layer is disposed between the photosensitive sensor and the receiving electrode, and the receiving electrode is disposed on a side of the spacer layer away from the photosensitive sensor; and
 a second substrate disposed on the first array structure layer, wherein the spacer layer comprises a first spacer sub-layer, and the first spacer sub-layer is disposed between the photosensitive sensor and the receiving electrode, and wherein the display device further comprises a light shielding layer disposed on the first spacer sub-layer and disposed on the semiconductor portion.

2. The display device as claimed in claim 1, wherein the first array structure layer further comprises a gate insulating layer, the gate is disposed on the first substrate, the gate insulating layer covers the gate, the transmitting electrode and the semiconductor portion are disposed in a same layer and are located on the gate insulating layer, the transmitting electrode and the semiconductor portion are insulated from each other, the semiconductor portion and the gate are disposed in one-to-one correspondence, and the source and the drain are disposed on opposite sides of the semiconductor portion and are electrically connected to the semiconductor portion.

3. The display device as claimed in claim 1, wherein the first array structure layer further comprises a gate insulating layer, the transmitting electrode and the gate are disposed in a same layer and are located on the first substrate, the gate insulating layer covers the transmitting electrode and the gate, the semiconductor portion is disposed on the gate insulating layer, the semiconductor portion and the gate are disposed in one-to-one correspondence, and the source and the drain are disposed on opposite sides of the semiconductor portion and are electrically connected to the semiconductor portion.

4. The display device as claimed in claim 1, wherein the spacer layer further comprises a second spacer sub-layer, the second spacer sub-layer is disposed on the first spacer sub-layer, and the receiving electrode is disposed on the second spacer sub-layer.

5. The display device as claimed in claim 4, wherein a dielectric constant of the first spacer sub-layer and a dielectric constant of the second spacer sub-layer range from 1.3 to 5.

6. The display device as claimed in claim 4, wherein a thickness of the first spacer sub-layer ranges from 1000 nm to 5000 nm, and a thickness of the second spacer sub-layer ranges from 1000 nm to 5000 nm.

7. The display device as claimed in claim 4, further comprising a first passivation layer disposed between the photosensitive sensor and the first spacer sub-layer.

8. The display device as claimed in claim 4, further comprising a second passivation layer disposed between the second spacer sub-layer and the receiving electrode.

9. The display device as claimed in claim 1, further comprising a display structure and an adhesive layer, wherein the display structure is adhered to the first substrate through the adhesive layer.

10. The display device as claimed in claim 9, wherein the display structure comprises a third substrate and a second array structure layer, the third substrate is located on a side away from the adhesive layer, and the second array structure layer is disposed on the third substrate.

11. The display device as claimed in claim 10, wherein the display structure further comprises a black matrix layer, the black matrix layer comprises a first black matrix portion and a second black matrix portion, the first black matrix portion is disposed on the second array structure layer in an array, and the second black matrix portion is disposed on opposite sides of the first black matrix portion.

12. The display device as claimed in claim 11, wherein the display structure further comprises a first conductive layer covering the second array structure layer and the first black matrix portion.

13. The display device as claimed in claim 12, wherein the display structure further comprises a liquid crystal layer disposed on the first conductive layer and in the second black matrix portion.

14. The display device as claimed in claim 13, wherein the display structure further comprises a second conductive layer covering the liquid crystal layer.

15. The display device as claimed in claim 14, wherein the display structure further comprises a color filter layer disposed on the second conductive layer.

16. The display device as claimed in claim 15, wherein the display structure further comprises a fourth substrate, the fourth substrate is disposed on the second black matrix portion and the color filter layer, and the fourth substrate is adhered to the first substrate through the adhesive layer.

* * * * *